United States Patent
Yeh et al.

(10) Patent No.: US 10,553,732 B2
(45) Date of Patent: Feb. 4, 2020

(54) CONDUCTIVE PASTE AND METHOD FOR PRODUCING SOLAR CELL BY USING THE SAME

(71) Applicant: GIGA SOLAR MATERIALS CORP., Hsinchu (TW)

(72) Inventors: Chih-Hsien Yeh, Hsinchu (TW); Po-Yang Shih, Hsinchu (TW); Jen-Ren Shen, Hsinchu (TW); Peng-Sheng Tseng, Hsinchu (TW)

(73) Assignee: GIGA SOLAR MATERIALS CORP., Hsinchu (TW)

(*) Notice: Subject to any disclaimer, the term of this patent is extended or adjusted under 35 U.S.C. 154(b) by 83 days.

(21) Appl. No.: 15/067,530

(22) Filed: Mar. 11, 2016

(65) Prior Publication Data
US 2016/0315208 A1 Oct. 27, 2016

(30) Foreign Application Priority Data

Apr. 27, 2015 (TW) .............................. 104113339 A

(51) Int. Cl.
| | | |
|---|---|---|
| H01L 51/42 | (2006.01) |
| H01L 31/0224 | (2006.01) |
| C03C 8/18 | (2006.01) |
| C03C 8/20 | (2006.01) |
| C03C 8/12 | (2006.01) |
| C03C 8/10 | (2006.01) |
| C03C 3/17 | (2006.01) |
| C03C 3/16 | (2006.01) |
| C03C 8/08 | (2006.01) |
| C03C 3/062 | (2006.01) |
| C03C 3/07 | (2006.01) |
| C03C 8/04 | (2006.01) |
| C03C 8/22 | (2006.01) |
| C03C 3/12 | (2006.01) |

(52) U.S. Cl.
CPC ...... *H01L 31/022425* (2013.01); *C03C 3/062* (2013.01); *C03C 3/07* (2013.01); *C03C 3/122* (2013.01); *C03C 3/16* (2013.01); *C03C 3/17* (2013.01); *C03C 8/04* (2013.01); *C03C 8/08* (2013.01); *C03C 8/10* (2013.01); *C03C 8/12* (2013.01); *C03C 8/18* (2013.01); *C03C 8/20* (2013.01); *C03C 8/22* (2013.01); *Y02E 10/50* (2013.01)

(58) Field of Classification Search
CPC ............ C03C 3/062; C03C 3/07; C03C 3/122
See application file for complete search history.

(56) References Cited

U.S. PATENT DOCUMENTS

| | | | | |
|---|---|---|---|---|
| 2013/0344342 A1* | 12/2013 | Ogata | .................... | H01B 1/22 428/426 |
| 2014/0290735 A1* | 10/2014 | Park | ................ | H01L 31/022425 136/256 |
| 2015/0060742 A1* | 3/2015 | Glicksman | ............... | H01B 1/22 252/514 |

FOREIGN PATENT DOCUMENTS

| | | | |
|---|---|---|---|
| JP | WO2014156964 | * | 10/2014 |
| TW | 201432920 A | | 8/2014 |

* cited by examiner

*Primary Examiner* — Mohammad M Choudhry
(74) *Attorney, Agent, or Firm* — Innovation Capital Law group; Vic Lin

(57) ABSTRACT

The present invention relates to a conductive paste and a method for producing solar cell by using the same. The conductive paste comprises at least silver powders and a composite glass frit comprising a first type of glass frit containing lead oxides and silicon oxides and a second type of glass frit containing tellurium oxides and zinc oxides wherein the first type of glass frit and the second type of glass frit are in a weight ratio of 93:7 to 44:56.

20 Claims, No Drawings

CONDUCTIVE PASTE AND METHOD FOR PRODUCING SOLAR CELL BY USING THE SAME

TECHNICAL FIELD OF THE INVENTION

The present invention relates to a conductive paste and a method for producing solar cell by using the same, in particular a conductive paste capable of enhancing conversion efficiency of a solar cell and a method for producing solar cell by using the same.

DESCRIPTION OF THE RELATED ART

Conductive paste is indispensable to recent electronic products. For example, the productions of solar cell, glass light board, flat-panel display, etc. all need use of conductive paste. Thus, good transmittance of electric energy and reduction of power transmitting loss are the basis for determining the quality of the conductive paste.

For the production of a solar cell, the conductive paste is an essential material. In the process for producing the solar cell by screen printing, the sequence for printing paste generally comprises: printing silver-aluminum paste first, drying, printing aluminum paste again, drying, finally printing silver paste and drying, and then co-firing. The silver paste is mainly used for the front electrode of the solar cell. The aluminum paste is used for the back electrode and electric field for enhancing conversion efficiency of the cell. The silver-aluminum paste is used for the back-side of the solar cell as conducting wires for connecting modules.

In the production of solar cell, there is a need to provide a contact paste for solving the following problems: providing good ohmic contact for the front silver electrode of solar cell after firing, higher fill factor (F.F.) and conversion efficiency (Eff %).

In order to solve the problems above, the applicant described in Taiwan Patent Application No. 102105109 "Conductive Paste for Enhancing Conversion Efficiency of Solar Cell" that use of two kinds of glass frits to form a mixture of glass frit. But the components of and the ratio between the said two types of glass frits are not defined. In addition, the obtained conductive paste still needs improvement.

BRIEF SUMMARY OF THE INVENTION

In view of above, the inventors work on improving the aforementioned patent application and conducting experiments, and the present invention is made accordingly.

The main object of the present invention is to provide a conductive paste capable of enhancing conversion efficiency of the solar cell and a method for producing solar cell.

In order to achieve the said object, the present invention was made based on the technical means below.

The present invention provides a conductive paste comprising at least silver powder; a composite glass frit comprising a first type of glass frit containing lead oxides and silicon oxides and a second type of glass frit containing tellurium oxides and zinc oxides wherein the first type of glass frit and the second type of glass frit are in a weight ratio of 93:7 to 44:56; and an organic vehicle.

In the first type of glass frit, the lead oxides are present in an amount of 40 to 74% by weight and the silicon oxides are present in an amount of 1 to 15% by weight. In the second type of glass frit, the tellurium oxides are present in an amount of 55 to 85% by weight and the zinc oxides are present in an amount of 10 to 40% by weight.

Preferably, the first type of glass frit further comprises at least one element selected from tin (Sn), phosphorus (P), bismuth (Bi), tellurium (Te), fluorine (F), lithium (Li), barium (Ba), aluminum (Al), magnesium (Mg), titanium (Ti), zirconium (Zr), vanadium (V), selenium (Se), molybdenum (Mo), tungsten (W), nickel (Ni), silver (Ag), erbium (Er), germanium (Ge), gallium (Ga), cerium (Ce), niobium (Nb), samarium (Sm) and lanthanum (La), or the oxides thereof.

Preferably, the second type of glass frit further comprises at least one element selected from tin (Sn), phosphorus (P), barium (Ba), aluminum (Al), magnesium (Mg), silicon (Si), lead (Pb), titanium (Ti), zirconium (Zr), vanadium (V), selenium (Se), silver (Ag), erbium (Er), germanium (Ge), gallium (Ga), cerium (Ce), niobium (Nb), bismuth (Bi), fluorine (F) and lithium (Li), or the oxides thereof.

Preferably, in the first type of glass frit, the lead oxides is lead oxide (PbO), and the silicon oxides is silicon dioxide ($SiO_2$). Preferably, in the second type of glass frit, tellurium oxides is tellurium dioxide ($TeO_2$), and zinc oxides is zinc oxide (ZnO).

Preferably, the conductive paste according to the present invention further comprises additives.

Preferably, the said additives are selected from the group consisting of zirconium oxide, vanadium pentoxide, silver oxide, erbium oxide, tin oxide, magnesium oxide, neodymium oxide, titanium dioxide, selenium dioxide, chromium(III) oxide, phosphorus pentoxide, tungsten trioxide, bismuth trioxide, manganese dioxide, nickel oxide, samarium oxide, germanium dioxide, zinc fluoride, indium(III) oxide, gallium(III) oxide and derivatives thereof.

The present invention further provides a method for producing solar cell by using the said conductive paste wherein the said conductive paste is used for forming a front electrode of the solar cell substrate.

According to the above construction of the present invention, a conductive paste with better conversion efficiency as compared with the existed conductive paste is provided.

In addition, the solar cell produced by using the conductive paste according to the present invention may have better photoelectric conversion efficiency.

BRIEF DESCRIPTION OF THE SEVERAL VIEWS OF THE DRAWING

None

DETAILED DESCRIPTION OF THE INVENTION

The conductive paste according to the present invention is used for enhancing the photoelectric conversion efficiency of solar cell. It is used for forming the front electrode (i.e. light receiving surface) of solar cell substrate. The conductive paste according to the present invention may be fired under low temperature, and the solar cell produced may have excellent photoelectric conversion efficiency accordingly.

The conductive paste according to the present invention comprises at least silver powder; a composite glass frit comprising a first type of glass frit containing lead oxides and silicon oxides and a second type of glass frit containing tellurium oxides and zinc oxides wherein the first type of glass frit and the second type of glass frit are in a weight ratio of 93:7 to 44:56; and an organic vehicle.

In the first type of glass frit, the lead oxides are present in an amount of 40 to 74% by weight and the silicon oxides are present in an amount of 1 to 15% by weight. In the second type of glass frit, the tellurium oxides are present in an amount of 55 to 85% by weight and the zinc oxides are present in an amount of 10 to 40% by weight.

The first type of glass frit further comprises at least one element selected from tin (Sn), phosphorus (P), bismuth (Bi), tellurium (Te), fluorine (F), lithium (Li), barium (Ba), aluminum (Al), magnesium (Mg), titanium (Ti), zirconium (Zr), vanadium (V), selenium (Se), molybdenum (Mo), tungsten (W), nickel (Ni), silver (Ag), erbium (Er), germanium (Ge), gallium (Ga), cerium (Ce), niobium (Nb), samarium (Sm) and lanthanum (La), or the oxides thereof.

Further, the second type of glass frit further comprises at least one element selected from tin (Sn), phosphorus (P), barium (Ba), aluminum (Al), magnesium (Mg), silicon (Si), lead (Pb), titanium (Ti), zirconium (Zr), vanadium (V), selenium (Se), silver (Ag), erbium (Er), germanium (Ge), gallium (Ga), cerium (Ce), niobium (Nb), bismuth (Bi), fluorine (F) and lithium (Li), or the oxides thereof.

Further, in an embodiment, in the first type of glass frit, the lead oxides is lead oxide (PbO), and the silicon oxides is silicon dioxide ($SiO_2$); in the second type of glass frit, tellurium oxides is tellurium dioxide ($TeO_2$), and zinc oxides is zinc oxide (ZnO).

Moreover, the conductive paste according to the present invention further comprises additives.

In addition, the said additives are selected from the group consisting of zirconium oxide, vanadium pentoxide, silver oxide, erbium oxide, tin oxide, magnesium oxide, neodymium oxide, titanium dioxide, selenium dioxide, chromium(III) oxide, phosphorus pentoxide, tungsten trioxide, bismuth trioxide, manganese dioxide, nickel oxide, samarium oxide, germanium dioxide, zinc fluoride, indium(III) oxide, gallium(III) oxide and derivatives thereof.

EXAMPLES

Next, Examples of the present invention will be described to illustrate that the present invention shows better photoelectric conversion efficiency.

Preparation of Composite Glass Frit

1. Preparation of the First Type of Glass Frit

The first type of glass frit mainly comprises lead oxides and silicon oxides. The samples of the first type of glass frit are made based on the components and the ratio listed in Table 1 below.

TABLE 1

| wt % | A1 | A2 | A3 | A4 | A5 | A6 | A7 |
|---|---|---|---|---|---|---|---|
| PbO | 53 | 74 | 69 | 71 | 46 | 65.5 | 72 |
| $SiO_2$ | 15 | 9 | 12 | 13 | 11 | 10 | 1 |
| $P_2O_5$ | 6 | 4 | — | — | 10 | 1.3 | 9 |
| $Bi_2O_3$ | — | 9 | 8 | 8.5 | 2 | 4.5 | — |
| ZnO | 8 | — | — | — | — | — | — |
| $SeO_2$ | 3 | — | 6 | — | 21 | 10 | 11 |
| $Li_2O$ | 7 | — | — | 1 | — | 5 | — |
| $Al_2O_3$ | 3 | | | | | | |
| $ZrO_2$ | 5 | 4 | — | — | 5 | 1.2 | 5 |
| $Er_2O_3$ | — | — | 5 | 6.5 | 5 | 2.5 | 2 |
| Tg(° C.) | 391 | 367 | 364 | 380 | 369 | 360 | 357 |
| Ts(° C.) | 421 | 384 | 383 | 392 | 378 | 400 | 371 |

From Table 1, it is clear that the glass transition temperature (Tg) and the glass softening temperature (Ts) of the first type of glass frit are ranging from 357° C. to 391° C. and from 371° C. to 421° C., respectively.

2. Preparation of the First Type of Glass Frit

The second type of glass frit mainly comprises tellurium oxides and zinc oxides. The samples the second type of glass frit are made based on the components and the ratio listed in Table 2 below.

TABLE 2

| wt % | B1 | B2 | B3 | B4 | B5 | B6 | B7 |
|---|---|---|---|---|---|---|---|
| $TeO_2$ | 65 | 84 | 81.5 | 73 | 73 | 64.5 | 56.5 |
| ZnO | 27.5 | 11 | 12.5 | 21 | 20.5 | 29.5 | 39.5 |
| $SiO_2$ | — | — | 1.5 | 3 | — | 1.5 | — |
| $P_2O_5$ | 7.5 | — | 1 | 0.5 | — | 0.7 | — |
| MgO | — | 2 | — | — | — | — | — |
| $Li_2O$ | — | — | 1.5 | 0.5 | — | 2.5 | 3.5 |
| $Al_2O_3$ | — | — | 2 | — | 1.5 | 0.5 | — |
| $SeO_2$ | — | 2 | — | 2 | 2.5 | 0.5 | — |
| $Er_2O_3$ | — | 1 | — | — | 2.5 | 0.3 | 0.5 |
| Tg(° C.) | 380 | 348 | 339 | 323 | 344 | 349 | 358 |
| Ts(° C.) | 400 | 365 | 355 | 338 | 359 | 366 | 373 |

From Table 2, it is clear that the glass transition temperature (Tg) and the glass softening temperature (Ts) of the second type of glass frit are ranging from 323° C. to 380° C. and from 338° C. to 400° C., respectively.

Preparation of the Conductive Paste According to Comparative Example (Single Glass Frit)

The conductive pastes are produced by using the first type of glass frit (A1 to A7) or the second type of glass frit (B1 to B7) only. The properties, i.e. open-circuit voltage (Voc), short circuit current (Isc), series resistance (Rs), fill factor (FF) and conversion efficiency (NCell), of the conductive pastes are determined and shown in Table 3 and Table 4 below.

TABLE 3

| | Properties | | | | |
|---|---|---|---|---|---|
| Glass Frit A | Voc | Isc | Rs | FF | NCell |
| A1 | 0.6219 | 8.335 | 0.0031 | 78.02 | 0.1662 |
| A2 | 0.6218 | 8.332 | 0.0030 | 77.93 | 0.1659 |
| A3 | 0.6205 | 8.373 | 0.0030 | 76.56 | 0.1635 |
| A4 | 0.6021 | 8.353 | 0.0029 | 76.86 | 0.1636 |
| A5 | 0.6215 | 8.341 | 0.0028 | 78.05 | 0.1662 |
| A6 | 0.6214 | 8.335 | 0.0028 | 78.14 | 0.1663 |
| A7 | 0.6211 | 8.339 | 0.0027 | 77.85 | 0.1657 |

TABLE 4

| | Properties | | | | |
|---|---|---|---|---|---|
| Glass Frit B | Voc | Isc | Rs | FF | NCell |
| B1 | 0.6227 | 8.285 | 0.0028 | 76.79 | 0.1628 |
| B2 | 0.6190 | 8.304 | 0.0067 | 72.39 | 0.1529 |
| B3 | 0.6211 | 8.324 | 0.0055 | 75.31 | 0.1600 |
| B4 | 0.6217 | 8.321 | 0.0051 | 75.84 | 0.1612 |
| B5 | 0.6198 | 8.312 | 0.0031 | 76.60 | 0.1621 |
| B6 | 0.6194 | 8.328 | 0.0036 | 76.11 | 0.1613 |
| B7 | 0.6204 | 8.326 | 0.0043 | 75.78 | 0.1609 |

From Table 3 and Table 4, it is known that the conversion efficiency (NCell) of the conductive pastes produced by the glass frit of single component is general between 15.29% and 16.63%.

Preparation of the Conductive Paste According to Inventive Example (Composite Glass Frit)

The glass frits listed in above Table 1 and Table 2 are fired at 900° C. to form composite glass frits and then, the conductive pastes are produced. The properties of the conductive pastes are determined. In the present experiment, the glass frits of A3 and B3 are used in a weight ratio of A3:B3=2 g to 4.5 g:0 g to 2.5 g to produce the experimental group and the control group of glass frit with single component. The results are shown in Table 5.

TABLE 5

| | Weigh Ratio of the Glass Frit (g) | | Properties | | | | |
|---|---|---|---|---|---|---|---|
| | A3 | B3 | Voc | Isc | Rs | FF | NCell |
| Control Group | 4.5 | 0 | 0.6205 | 8.373 | 0.0030 | 76.56 | 0.1635 |
| Experimental Group 1 | 4.2 | 0.3 | 0.6213 | 8.630 | 0.0026 | 79.78 | 0.1758 |
| Experimental Group 2 | 3.9 | 0.6 | 0.6210 | 8.644 | 0.0025 | 79.86 | 0.1761 |
| Experimental Group 3 | 3.6 | 0.9 | 0.6221 | 8.645 | 0.0027 | 79.80 | 0.1764 |
| Experimental Group 4 | 3.3 | 1.2 | 0.6236 | 8.650 | 0.0030 | 79.21 | 0.1756 |
| Experimental Group 5 | 2 | 2.5 | 0.6218 | 8.654 | 0.0049 | 77.25 | 0.1708 |

From Table 5, it is clear that the conversion efficiency of the conductive pastes comprising composite glass frit is general 17% or higher, in which the electric properties and the conversion efficiency of Experimental Group 3 is preferable.

The Influences on the Properties of the Conductive Paste Caused by the Components Comprised in the Composite Glass Frit The composite glass frits are produced by using the weight ratio adapted in above Experimental Group 3 (i.e. A:B=3.6 g:0.9 g) and using only the glass frit of component A3 in Table 1 together with the glass fits of components B1 to B7 in Table 2. The firing temperature is 900° C. The properties thereof are determined and shown in Table 6.

TABLE 6

| | Weigh Ratio of the Glass Frit (g) | | Properties | | | | |
|---|---|---|---|---|---|---|---|
| Glass Frit | A3 | B | Voc | Isc | Rs | FF | NCell |
| B1 | 3.6 | 0.9 | 0.6221 | 8.659 | 0.0028 | 79.57 | 0.1762 |
| B2 | | | 0.6210 | 8.644 | 0.0025 | 79.86 | 0.1761 |
| B3 | | | 0.6221 | 8.645 | 0.0027 | 79.80 | 0.1764 |
| B4 | | | 0.6213 | 8.630 | 0.0026 | 79.78 | 0.1758 |
| B5 | | | 0.6236 | 8.650 | 0.0030 | 79.21 | 0.1756 |
| B6 | | | 0.6218 | 8.654 | 0.0049 | 77.25 | 0.1708 |
| B7 | | | 0.6221 | 8.660 | 0.0050 | 77.11 | 0.1708 |

The composite glass frits are produced by using the weight ratio adapted in above Experimental Group 3 (i.e. A:B=3.6 g:0.9 g) and using only the glass frit of component B3 in Table 2 together with the glass fits of components A1 to A7 in Table 1. The firing temperature is 900° C. The properties thereof are determined and shown in Table 7.

TABLE 7

| | Weigh Ratio of the Glass Frit (g) | | Properties | | | | |
|---|---|---|---|---|---|---|---|
| Glass Frit | A | B3 | Voc | Isc | Rs | FF | NCell |
| A1 | 3.6 | 0.9 | 0.6225 | 8.65 | 0.0030 | 79.20 | 0.1752 |
| A2 | | | 0.6212 | 8.66 | 0.0031 | 79.02 | 0.1747 |
| A3 | | | 0.6221 | 8.645 | 0.0027 | 79.80 | 0.1764 |
| A4 | | | 0.6225 | 8.66 | 0.0031 | 79.26 | 0.1757 |
| A5 | | | 0.6219 | 8.65 | 0.0031 | 79.12 | 0.1749 |
| A6 | | | 0.6216 | 8.65 | 0.0050 | 77.15 | 0.1705 |
| A7 | | | 0.6237 | 8.68 | 0.0033 | 78.43 | 0.1746 |

From Table 6 and Table 7, it is clear that the conversion efficiency of the conductive pastes according to the present invention is general between 17.08% and 17.64% since composite glass frit is comprised. The conversion efficiency of the conductive pastes according to the present invention increases about 1% as compared with the conductive pastes of glass frit with single component.

Preparing Process of Conductive Paste

In the case of single glass frit A3, 86 wt % of silver powder and 4.5 wt % of glass frit are added into 9.5 wt % of organic vehicle, and then mixed to form a conductive paste. Further, the mixing manner of the composite glass frit (A+B) is, for example, use of A3 and B3 in Table 1 and Table 2 (namely, the first type of glass frit A3 containing lead oxides and silicon oxides and the second type of glass frit B3 containing tellurium oxides and zinc oxides) for producing the conductive paste.

In the case of Experimental Group 3, 86 wt % of silver powder and 4.5 wt % of glass frit (3.6 g of A3 component and 0.9 g of B3 component; total weight 4.5 g) are added into 9.5 wt % of organic vehicle, and then defoaming and premixing by using a mixer.

The weight ratio between the two glass frits may be, for example, A3 is 2 g to 4.5 g to B3 is 0 g to 2.5 g. Alternatively, the glass frit of A3 in table 1 is fixed as 3.6 g and combined with B1 to B7 in a fixed amount of 0.9 g to produce the conductive pastes. Alternatively, the glass frit of B3 in table 1 is fixed as 3.6 g and combined with A1 to A7 in a fixed amount of 0.9 g to produce the conductive pastes.

The silver powder may be in the form of metal silver, silver derivatives or mixture thereof. Exemplary derivatives comprise silver alloy, silver oxide ($Ag_2O$), silver salts such as AgCl, $AgNO_3$, $AgOOCCH_3$ (silver acetate) and AgO-$OCF_3$ (silver trifluoroacetate), or silver orthophosphate such as $Ag_3PO_4$. The silver in other forms which is compatible with other thick film pastes may be used.

Suitable organic vehicle has the rheological properties capable of providing stable solid dispersibility, viscosity and thixotropy suitable for screen printing, suitable wettability of substrate and paste solid, good drying rate and good firing properties. The organic vehicle may comprise thickeners, stabilizers, surfactants and/or other common additives. The organic vehicle is a solution formed from dissolving a polymer in a solvent. Suitable polymer comprises ethyl cellulose, ethylhydroxyethyl cellulose, wood rosin, a mixture of ethyl cellulose and phenol resin, polymethacrylate of lower alcohols and monobutyl ether of ethylene glycol monoacetate. Suitable solvent comprises terpenes such as α- or β-terpineol or mixture thereof or other solvents such as kerosene, dibutyl phthalate, butyl carbitol, butyl carbitol acetate, hexylene glycol and alcohols with a boiling point of 150° C. or more, and alcohol esters. Other suitable organic medium comprises bis(2-(2-butoxyethoxy)ethyl adipate, dibasic esters such as DBE, DBE-2, DBE-3, DBE-4, DBE-5, DBE-6, DBE-9 abd Dbe 1B, octyl epoxy tallate, isotetradecanol and pentaerythritol ester of hydogenated rosin. The organic vehicle may also comprise volatile liquid to promote the hardening after applying the thick film paste composition onto the substrate. It should be noted that the oxides contained in the glass is limited to the exemplified examples. Lead oxides may be for example $Pb_3O_4$.

After premixing, the mixture comprising silver powder, glass frit, organic vehicle and additives is dispersed and ground uniformly by using a three-roll mill. The paste obtained after mixing is the conductive silver paste.

In addition, in the preparation of the conductive paste according to the present invention, the organic vehicle is obtained by for example dissolving 5 to 25 g of ethyl cellulose (EC) in 5 to 75 g of an organic solvent. In addition to the process for the preparation of the composite glass frit described above, the conductive paste according to the present invention may be also prepared by the following process. For example, 70 to 95 g of silver powder (particular size ranged from 0.1 to 10.0 μm), 10 to 30 g of an organic vehicle and 1 to 10 g of composite glass frit are mixed and dispersed uniformly by using a roller, and the conductive paste according to the present invention is thereby obtained.

To sum up, the present invention uses the glass frits with the above-described components and ratio to form a composite glass frit, and disperses and mixes the composite glass frit in the conductive paste. Thus, the conductive paste obtained would show excellent conversion efficiency, and the solar cell produced by using the conductive paste according to the present invention would have better photoelectric conversion efficiency accordingly.

What is claimed is:

1. A conductive paste for forming a front electrode of a solar cell, the conductive paste comprising at least:
   70-95 weight percent silver powder;
   1-10 weight percent of a mixture of glass frit comprising a first type of glass frit containing lead oxides and silicon oxides and a second type of glass frit containing tellurium oxides and zinc oxides wherein the first type of glass frit and the second type of glass frit are in a weight ratio of 93:7 to 44:56; and
   10-30 weight percent of an organic vehicle, wherein
   a glass softening temperature (Ts) of the first type of glass frit ranges from 370° C. to 420° C., and a glass softening temperature (Ts) of the second type of glass frit ranges from 340° C. to 400° C.; and
   the conductive paste forms the front electrode of the solar cell.

2. The conductive paste according to claim 1, wherein in the first type of glass frit, the lead oxides are present in an amount of 40 to 74% by weight and the silicon oxides are present in an amount of 1 to 15% by weight; and in the second type of glass frit, the tellurium oxides are present in an amount of 55 to 85% by weight and the zinc oxides are present in an amount of 10 to 40% by weight.

3. The conductive paste according to claim 1, wherein the first type of glass frit further comprises at least one element selected from tin (Sn), phosphorus (P), bismuth (Bi), tellurium (Te), fluorine (F), lithium (Li), barium (Ba), aluminum (Al), magnesium (Mg), titanium (Ti), zirconium (Zr), vanadium (V), selenium (Se), molybdenum (Mo), tungsten (W), nickel (Ni), silver (Ag), erbium (Er), germanium (Ge), gallium (Ga), cerium (Ce), niobium (Nb), samarium (Sm) and lanthanum (La), or the oxides thereof.

4. The conductive paste according to claim 1, wherein the second type of glass frit further comprises at least one element selected from tin (Sn), phosphorus (P), barium (Ba), aluminum (Al), magnesium (Mg), silicon (Si), lead (Pb), titanium (Ti), zirconium (Zr), vanadium (V), selenium (Se), silver (Ag), erbium (Er), germanium (Ge), gallium (Ga), cerium (Ce), niobium (Nb), bismuth (Bi), fluorine (F) and lithium (Li), or the oxides thereof.

5. The conductive paste according to claim 1, wherein in the first type of glass frit, the lead oxides is lead oxide (PbO), and the silicon oxides is silicon dioxide ($SiO_2$); and in the second type of glass frit, tellurium oxides is tellurium dioxide ($TeO_2$), and zinc oxides is zinc oxide (ZnO).

6. The conductive paste according to claim 1, which further comprises an additive.

7. The conductive paste according to claim 6, wherein the additive is selected from the group consisting of zirconium oxide, vanadium pentoxide, silver oxide, erbium oxide, tin oxide, magnesium oxide, neodymium oxide, titanium dioxide, selenium dioxide, chromium(III) oxide, phosphorus pentoxide, tungsten trioxide, bismuth trioxide, manganese dioxide, nickel oxide, samarium oxide, germanium dioxide, zinc fluoride, indium(III) oxide, gallium(III) oxide and derivatives thereof.

8. A method for producing solar cell which uses the conductive paste according claim 1 for forming the front electrode of the solar cell.

9. A method for producing solar cell which uses the conductive paste according to claim 2 for forming the front electrode of the solar cell.

10. A method for producing solar cell which uses the conductive paste according to claim 3 for forming the front electrode of the solar cell.

11. A method for producing solar cell which uses the conductive paste according to claim 4 for forming the front electrode of the solar cell.

12. A method for producing solar cell which uses the conductive paste according to claim 5 for forming the front electrode of the solar cell.

13. A method for producing solar cell which uses the conductive paste according to claim 6 for forming the front electrode of the solar cell.

14. A method for producing solar cell which uses the conductive paste according to claim 7 for forming the front electrode of the solar cell.

15. The conductive paste of claim 1, wherein a glass transition temperature (Tg) of the first type of glass frit ranges from 350° C. to 400° C., and a glass transition temperature (Tg) of the second type of glass frit ranges from 320° C. to 380° C.

16. The conductive paste according to claim 15, wherein the glass transition temperature (Tg) of the first type of glass frit is higher than the glass transition temperature (Tg) of the second type of glass frit.

17. The conductive paste according to claim 15, wherein difference of the glass transition temperature (Tg) of the first type of glass frit and the glass transition temperature (Tg) of the second type of glass frit is between 20° C. to 80° C.

18. The conductive paste according to claim 1, wherein the glass softening temperature (Ts) of the first type of glass frit is higher than the glass softening temperature (Ts) of the second type of glass frit.

19. The conductive paste according to claim 1, wherein difference of the glass transition temperature (Tg) of the first type of glass frit and the glass transition temperature (Tg) of the second type of glass frit is between 20° C. to 80° C.

20. The conductive past according to claim 1, the second type of glass frit consists of tellurium oxides, zinc oxides and one or more optional elements, or oxides thereof, selected from the group consisting of tin (Sn), phosphorus (P), barium (Ba), aluminum (Al), magnesium (Mg), silicon (Si), lead (Pb), titanium (Ti), zirconium (Zr), vanadium (V), selenium (Se), silver (Ag), erbium (Er), germanium (Ge), gallium (Ga), cerium (Ce), niobium (Nb), bismuth (Bi), fluorine (F) and lithium (Li).

* * * * *